United States Patent
Templier et al.

(10) Patent No.: US 10,734,439 B2
(45) Date of Patent: Aug. 4, 2020

(54) METHOD FOR PRODUCING AN OPTOELECTRONIC DEVICE COMPRISING A PLURALITY OF GALLIUM NITRIDE DIODES

(71) Applicants: Commissariat à l'Énergie Atomique et aux Énergies Alternatives, Paris (FR); Thales, Courbevoie (FR)

(72) Inventors: François Templier, Grenoble (FR); Lamine Benaissa, Massy (FR); Marc Rabarot, Saint-Egreve (FR)

(73) Assignees: Commissariat à l'Énergie Atomique et aux Énergies Alternatives, Paris (FR); Thales, Courbevoie (FR)

( * ) Notice: Subject to any disclaimer, the term of this patent is extended or adjusted under 35 U.S.C. 154(b) by 0 days.

(21) Appl. No.: 16/095,335

(22) PCT Filed: May 13, 2016

(86) PCT No.: PCT/FR2016/051140
§ 371 (c)(1),
(2) Date: Oct. 19, 2018

(87) PCT Pub. No.: WO2017/194845
PCT Pub. Date: Nov. 16, 2017

(65) Prior Publication Data
US 2019/0131343 A1    May 2, 2019

(51) Int. Cl.
*H01L 27/15* (2006.01)
*H01L 33/00* (2010.01)
(Continued)

(52) U.S. Cl.
CPC ........ *H01L 27/153* (2013.01); *H01L 25/0756* (2013.01); *H01L 27/15* (2013.01);
(Continued)

(58) Field of Classification Search
CPC ....... H01L 27/153; H01L 31/00; H01L 27/15; H01L 25/0756; H01L 31/102;
(Continued)

(56) References Cited

U.S. PATENT DOCUMENTS

2010/0171215 A1*  7/2010  Fischer .................. H01L 24/97
                                                                     257/734
2013/0049038 A1    2/2013  Jeong et al.
(Continued)

OTHER PUBLICATIONS

International Search Report dated Jan. 18, 2017 in connection with Application No. PCT/FR2016/051140.
(Continued)

*Primary Examiner* — David Vu
(74) *Attorney, Agent, or Firm* — Wolf, Greenfield & Sacks, P.C.

(57) ABSTRACT

A method of manufacturing an optoelectronic device, including the successive steps of: a) transferring, onto a surface of a control integrated circuit including a plurality of metal connection pads, an active diode stack including at least first and second doped semiconductor layers of opposite conductivity types, so that the second layer of the stack is electrically connected to the metal pads of the control circuit; and b) forming in the active stack trenches delimiting a plurality of diodes connected to different metal pads of the control circuit.

15 Claims, 5 Drawing Sheets

(51) Int. Cl.
  *H01L 33/40* (2010.01)
  *H01L 33/42* (2010.01)
  *H01L 31/102* (2006.01)
  *H01L 31/00* (2006.01)
  *H01L 25/075* (2006.01)

(52) U.S. Cl.
  CPC ............ *H01L 31/00* (2013.01); *H01L 31/102* (2013.01); *H01L 33/0079* (2013.01); *H01L 33/405* (2013.01); *H01L 33/42* (2013.01); *H01L 25/0753* (2013.01)

(58) Field of Classification Search
  CPC ... H01L 33/42; H01L 33/405; H01L 33/0079; H01L 25/0753; H01L 27/156
  See application file for complete search history.

(56) References Cited

U.S. PATENT DOCUMENTS

| | | |
|---|---|---|
| 2013/0126890 A1 | 5/2013 | Bedell et al. |
| 2015/0115387 A1 | 4/2015 | Buckley et al. |
| 2015/0333047 A1 | 11/2015 | Pfeuffer |

OTHER PUBLICATIONS

Written Opinion for International Application No. PCT/FR2016/051140, dated Jan. 18, 2017.
International Preliminary Report on Patentability for International Application No. PCT/FR2016/051140, dated Nov. 22, 2018.

\* cited by examiner

METHOD FOR PRODUCING AN OPTOELECTRONIC DEVICE COMPRISING A PLURALITY OF GALLIUM NITRIDE DIODES

CROSS-REFERENCE TO RELATED APPLICATIONS

This Application is a national stage filing under 35 U.S.C. § 371 of International Patent Application Serial No. PCT/FR2016/051140, filed May 13, 2016. The entire contents of this application is incorporated herein by reference in its entirety.

BACKGROUND

The present application relates to the field of optoelectronic devices. It more specifically relates to a method of manufacturing an optoelectronic device comprising a plurality of gallium nitride diodes, and an electronic circuit for controlling these diodes.

DISCUSSION OF THE RELATED ART

An emissive display device comprising an assembly of gallium nitride light-emitting diodes (LEDs), and a control circuit enabling to individually control the LEDs in order to display images.

To form such a device, it may be provided to separately manufacture the control circuit and the LED assembly, and then to connect them to each other to obtain the display device. The control circuit may be integrated inside and on top of a semiconductor substrate, for example, a silicon substrate. As an example, the control circuit is manufactured in CMOS technology. On the side of one of its surfaces, the control circuit may comprise a plurality of metal pads, each pad being intended to be connected to an electrode of a LED from the LED assembly, to be able to individually control the LEDs. The LED assembly is for example monolithically formed on a support substrate, and then transferred onto the control circuit so that each LED has an electrode (anode or cathode) connected to one of the metal pads of the control circuit.

A disadvantage of such a manufacturing method is the need to accurately align the control circuit and the LED assembly during the step of assembling the two elements, so that each LED is effectively positioned on the metal pad corresponding thereto in the control circuit. Such an alignment is particularly difficult to achieve when the pixel pitch decreases, and is an obstacle to an increase in the resolution and/or in the pixel integration density.

Another approach to form an optoelectronic device comprising an assembly of gallium nitride LEDs and a circuit for controlling these LEDs comprises monolithically forming all the LEDs on a support substrate, and then depositing TFT-type transistors ("Thin Film Transistor") on the LED assembly to form the control circuit.

A disadvantage of this approach lies in the relatively low performance and in the relatively high manufacturing dispersions of the TFTs of the control circuit. Further, TFTs are relatively bulky, which, here again, limits the increase in the resolution and/or in the pixel integration density.

SUMMARY

Thus, an embodiment provides an optoelectronic device manufacturing method, comprising the successive steps of:

a) transferring, onto a surface of an integrated control circuit comprising a plurality of metal connection pads, an active diode stack comprising at least first and second doped semiconductor layers of opposite conductivity types, so that the second layer of the stack is electrically connected to the metal pads of the control circuit; and b) forming in the active stack trenches delimiting a plurality of diodes connected to different metal pads of the control circuit.

According to an embodiment, the method further comprises, before a), at least one of the following steps: a step of depositing at least one first metal layer over substantially the entire surface of the control circuit on the side of the metal pads; and a step of depositing at least one second metal layer over substantially the entire surface of the second semiconductor layer opposite to the first semiconductor layer.

According to an embodiment, at least one of the first and second metal layers comprises a silver reflective layer.

According to an embodiment, at least one of the first and second metal layers comprises a barrier layer made of TaN, TiN, WN, TiW or of a combination of one or a plurality of these materials.

According to an embodiment, at least one of the first and second metal layers comprises a bonding layer made of Ti, Ni, Pt, Sn, Au, Ag, Al, Pd, W, Pb, Cu, AuSn, TiSn, NiSn, or of an alloy of all or part of these materials.

According to an embodiment, the trenches formed at step b) extend all along the height of the active stack and cross the first and second metal layers.

According to an embodiment, during the implementation of step a), the active stack is supported by a support substrate located on the side of the first semiconductor layer opposite to the second semiconductor layer, the method further comprising, between step a) and step b), a step of removing the support substrate.

According to an embodiment, the method further comprises, after step b), a step of depositing, on each diode, an electrode on top of and in contact with the surface of the first semiconductor layer opposite to the second semiconductor layer.

According to an embodiment, the electrodes form a continuous metal grid arranged so that, at the level of each diode, in a peripheral portion of the diode, the surface of the first semiconductor layer opposite to the second semiconductor layer is in contact with the grid and, in a central portion of the diode, the surface of the first semiconductor layer is not coated with the grid.

According to an embodiment, the electrodes form a continuous layer made of a transparent conductive material, substantially coating the entire surface of the device.

According to an embodiment, the semiconductor diodes are light-emitting diodes.

According to an embodiment, the method further comprises, after step b), a step of transferring, onto the surface of the device opposite to the control circuit, a photoluminescent conversion stack with multiple quantum wells substantially coating the entire surface of the device.

According to an embodiment, the method further comprises, after the transfer of the conversion stack, a step of removing the conversion stack opposite some only of the semiconductor diodes.

According to an embodiment, the diodes are photodiodes.

According to an embodiment, the first and second semiconductor layers are gallium nitride layers, the diodes being gallium nitride diodes.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1A:
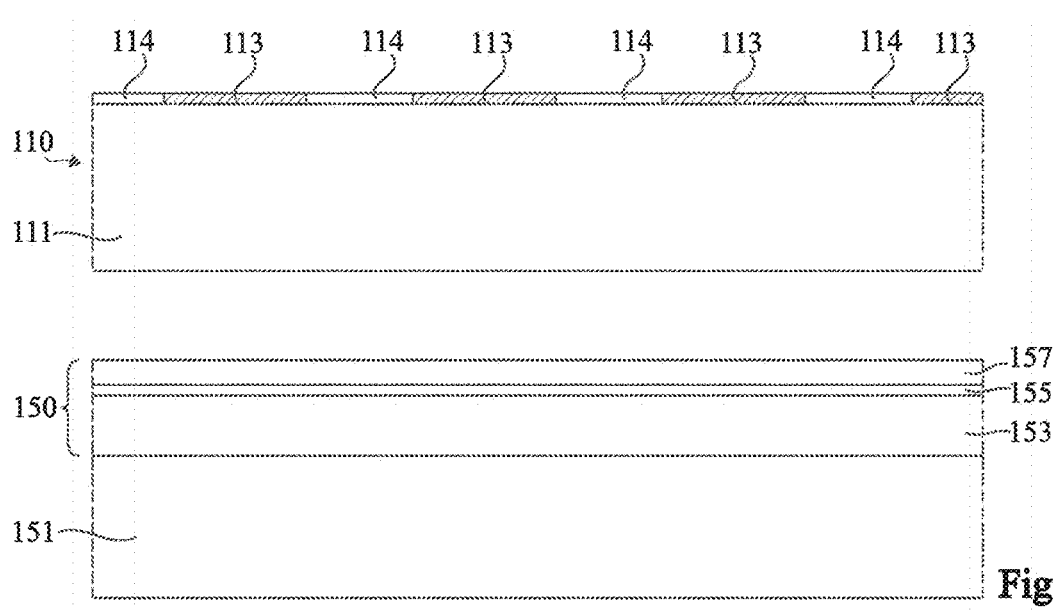
FIGS. 1A, 1B, 1C, 1D, 1E, 1F, 1G, 1H, 1I are cross-section views illustrating steps of an embodiment of an optoelectronic device manufacturing method.

The same elements have been designated with the same reference numerals in the different drawings and, further, the various drawings are not to scale. For clarity, only those elements which are useful to the understanding of the described embodiments have been shown and detailed. In particular, the forming of an integrated circuit for controlling gallium nitride diodes has not been detailed, the described embodiments being compatible with usual structures and methods of manufacturing such control circuits. Further, the composition and the layout of the different layers of an active gallium nitride diode stack have not been detailed, the described embodiments being compatible with usual active gallium nitride diode stacks. In the following description, unless otherwise specified, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", "lateral", etc., it is referred to the orientation of the corresponding drawings, it being understood that, in practice, the described devices and assemblies may be oriented differently. Unless otherwise specified, expressions "approximately", "substantially", and "in the order of" mean to within 10%, preferably to within 5%.

According to an aspect of an embodiment, it is provided, to manufacture an optoelectronic device comprising a plurality of gallium nitride LEDs and an electronic circuit for controlling these LEDs, to:

first form the control circuit in the form of an integrated circuit comprising, on a surface, a plurality of metal pads intended to be connected to the LEDs to be able to control, for example, individually, the current flowing through the LEDs;

then place on the surface of the control circuit comprising the metal pads an active gallium nitride LED stack comprising at least first and second doped gallium nitride layers of opposite conductivity types, so that one of the first and second gallium nitride layers of the stack is electrically in contact with the metal pads of the control circuit; and then structuring the active stack to determine in the stack the different LEDs of the device.

An advantage of this manufacturing method is that, during the step of transferring the active gallium nitride LED stack onto the control circuit, the positions of the different LEDs of the device in the active stack are not defined yet. There is accordingly no strong alignment accuracy constraint during the transfer. The delimitation of the different LEDs in the active stack can then be performed by methods of substrate structuring and of deposition of insulating and conductive layers on a substrate, which provide an alignment accuracy much greater than the accuracy that may be obtained during the transfer of a substrate onto another one.

FIGS. 1A, 1B, 1C, 1D, 1E, 1F, 1G, 1H, 1I are cross-section views illustrating steps of an embodiment of an optoelectronic device manufacturing method.

FIG. 1A schematically shows an integrated control circuit 110, previously formed inside and on top of a semiconductor substrate 111, for example, a silicon substrate. In this example, control circuit 110 comprises, on its upper surface side, for each of the LEDs of the device, a metal connection pad 113 intended to be connected to one of the electrodes (anode or cathode) of the LED, to be able to control a current flowing through the LED and/or to apply a voltage across the LED. The control circuit further comprises, for each LED, connected to the metal pad 113 dedicated to the LED, an elementary control cell comprising one or a plurality of transistors, enabling to control the current flowing through the LED and/or a voltage applied across the LED. Control circuit 110 is for example made in CMOS technology. Metal pads 113 may be laterally surrounded with an insulating material 114, for example, silicon oxide, so that control circuit 110 has a substantially planar upper surface comprising an alternation of metal regions 113 and of insulating regions 114. The contact on the electrodes of the LEDs (cathodes or anodes) which are not connected to pads 113 may be taken collectively, for example, in a peripheral region of control circuit 110, via one or a plurality of connection pads (not shown in the drawing) of control circuit 110.

FIG. 1A further schematically shows an active gallium nitride LED stack 150, arranged on the upper surface of a support substrate 151. Support substrate 151 is for example a substrate made of silicon, of sapphire, of corundum, or of any other material onto which an active gallium nitride LED stack can be deposited. In the shown example, the active stack comprises, in the following order from the upper surface of substrate 151, an N-type doped gallium nitride layer 153, an emissive layer 155, and a P-type doped gallium nitride layer 157. Emissive layer 155 is for example formed of a stack of one or a plurality of emissive layers each forming a quantum well, for example, containing GaN, InN, InGaN, AlGaN, AN, AlInGaN, GaP, AlGaP, AlInGaP, or a combination of one or a plurality of these materials. As a variation, emissive layer 155 may be an intrinsic, that is, non-intentionally doped, gallium nitride layer, for example having a residual donor concentration in the range from 1015 to 1018 atoms/cm3, for example, in the order of 1017 atoms/cm3. In this example, the lower surface of emissive layer 155 is in contact with the upper surface of layer 153, and the upper surface of emissive layer 155 is in contact with the lower surface of layer 157. In practice, according to the nature of substrate 151, a stack of one or a plurality of buffer layers (not shown) may form an interface between support substrate 151 and gallium nitride layer 153. Active stack 150 is for example deposited by epitaxy on support substrate 151.

Figure 1B:
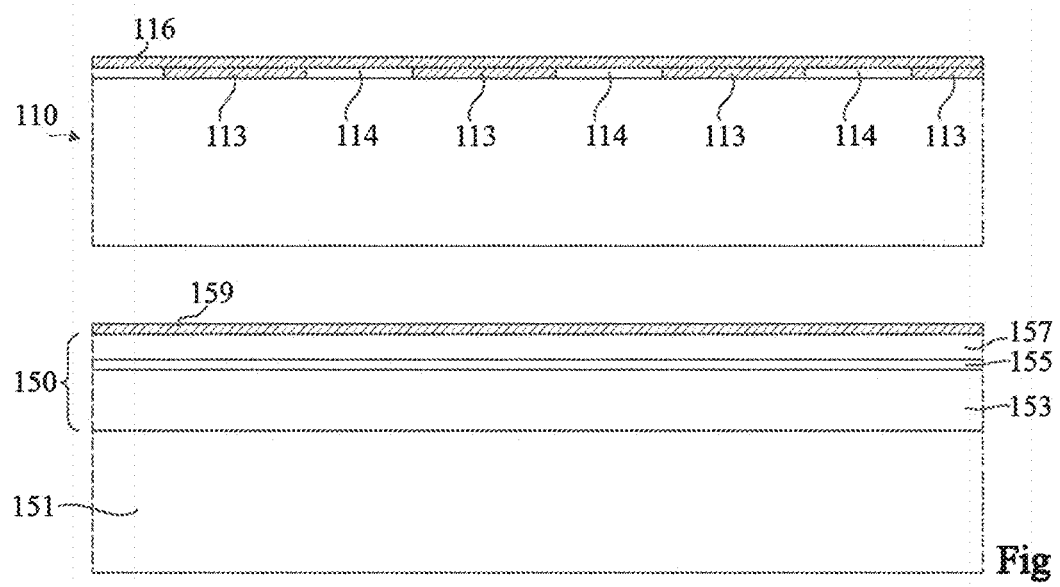

FIG. 1B illustrates a step of depositing, on the upper surface of control circuit 110, a metal layer 116. In the shown example, metal layer 116 coats substantially the entire upper surface of control circuit 110. In particular, metal layer 116 is in contact with metal connection pads 113 of control circuit 110.

FIG. 1B further illustrates a step of depositing, on the upper surface of active gallium nitride diode stack 150, a metal layer 159. In the shown example, metal layer 159 is arranged on top of and in contact with the upper surface of gallium nitride layer 157. Metal layer 159 for example coats substantially the entire upper surface of the active stack.

Figure 1C:
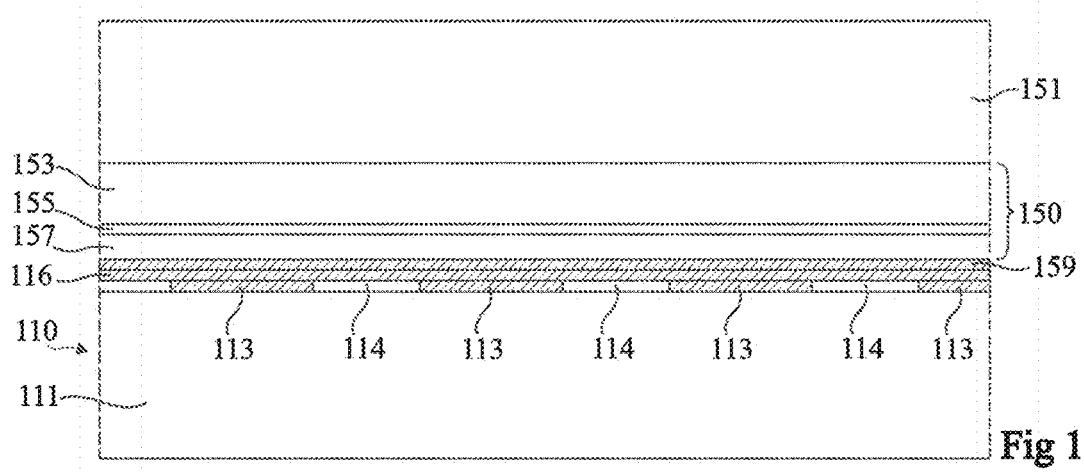

FIG. 1C illustrates a step during which active gallium nitride LED stack 150 is placed on the upper surface of control circuit 110. To achieve this, the assembly comprising support substrate 151 and active stack 150 may be flipped, and then placed on control circuit 110, to place the upper surface (in the orientation of FIG. 1B) of metal layer 159 into contact with the upper surface of metal layer 116. During this step, active stack 150 is bonded to control circuit 110. As an example, the bonding of active stack 150 to control circuit 110 may be obtained by molecular bonding between the two surfaces which have been placed into contact. As a variation, the bonding of the two surfaces may be performed by thermocompression, eutectic bonding, or by any other adapted bonding method.

Figure 1D:
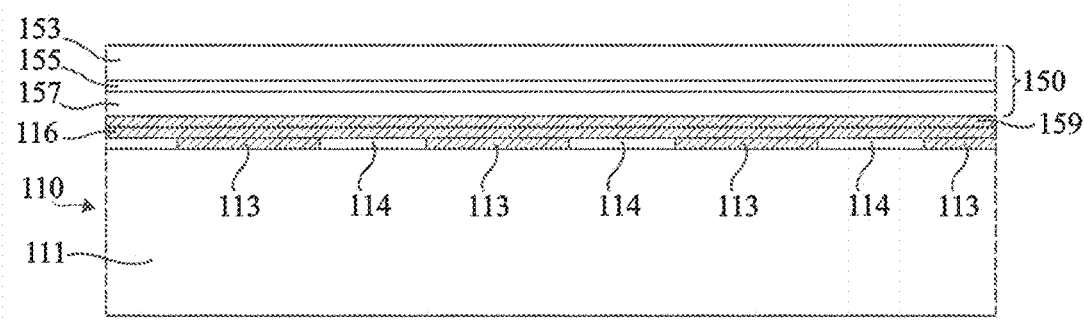

FIG. 1D illustrates a step subsequent to the transfer step of FIG. 1C, during which support substrate 151 of active gallium nitride LED stack 150 is removed to expose the upper surface of gallium nitride layer 153. Substrate 151 is for example removed by grinding and/or etching from its surface opposite to active stack 150. As a variation, in the case of a transparent substrate 151, for example, a sapphire or corundum substrate, substrate 151 may be separated from active stack 150 by means of a laser beam projected through substrate 151 from its surface opposite to active stack 150 (lift-off laser method). More generally, any other method enabling to remove substrate 151 may be used. After the removal of the substrate, an additional etch step may be provided to remove possible buffer layers remaining on the upper surface side of gallium nitride layer 153. Further, a portion of the thickness of gallium nitride layer 153 may be removed, for example, by etching. At the end of this step, active stack 150 coats substantially the entire surface of control circuit 110, with no discontinuity. As an example, the thickness of active stack 150 at the end of the step of FIG. 1D is in the range from 0.5 to 2 µm.

Figure 1E:
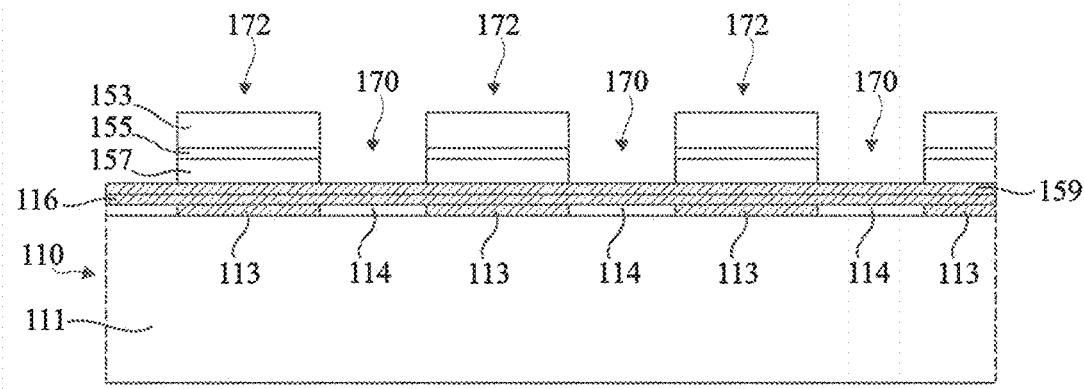

FIG. 1E illustrates a step subsequent to the step of FIG. 1D, during which trenches are formed in active stack 150, from its upper surface, for example by lithography and then etching, to delimit a plurality of gallium nitride LEDs 172. Each LED 172 corresponds to an island or mesa formed in stack 150 and laterally surrounded with a trench 170. Trenches 170 extend vertically along the entire height of stack 150. Thus, each LED 172 comprises a vertical stack comprising, in the following order from the upper surface of metal layer 159, a portion of gallium nitride layer 157, corresponding to the anode of the LED in this example, a portion of emissive layer 155, and a portion of gallium nitride layer 153, corresponding to the cathode of the LED in this example. Trenches 170 may be aligned on marks previously formed on control circuit 110. In the shown example, each LED 172 is located, in vertical projection, opposite a single metal pad 113 of control circuit 110. In this example, trenches 170 are located, in vertical projection, opposite insulating regions 114 of the upper surface of control circuit 110. In the shown example, metal layer 159 is used as an etch stop layer during the forming of trenches 170 in active stack 150.

Figure 1F:
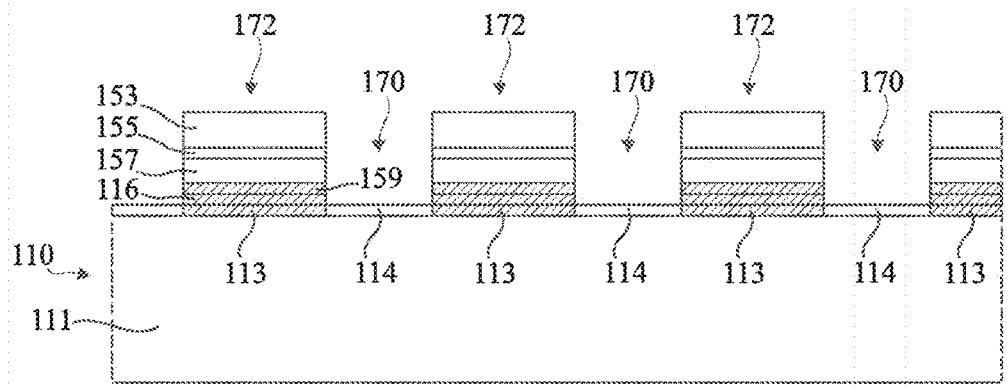

FIG. 1F illustrates a subsequent step of removing, for example, by etching, portions of metal layers 159 and 116 located at the bottom of trenches 170, to continue trenches 170 all the way to insulating regions 114 of the upper surface of control circuit 110. At the end of this step, the anodes (regions 157) of the different LEDs 172 are electrically insulated from one another by trenches 170, and each LED 172 has its anode connected to underlying metal pad 113 via portions of metal layers 159 and 116 remaining between the LED and pad 113. This enables to individually control the LEDs with control circuit 110.

Figure 1G:
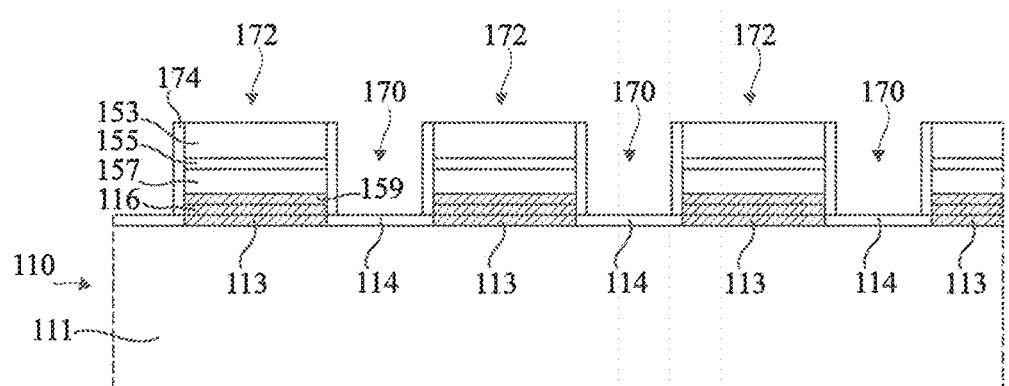

FIG. 1G illustrates a subsequent step of depositing, on the sides of LEDs 172, an insulating passivation layer 174, for example, made of silicon oxide. Layer 174 is for example deposited over the entire upper surface of the assembly by a conformal deposition technique, and then only removed from the upper surface of LEDs 172 and from the bottom of trenches 170, for example, by anisotropic etching.

Figure 1H:
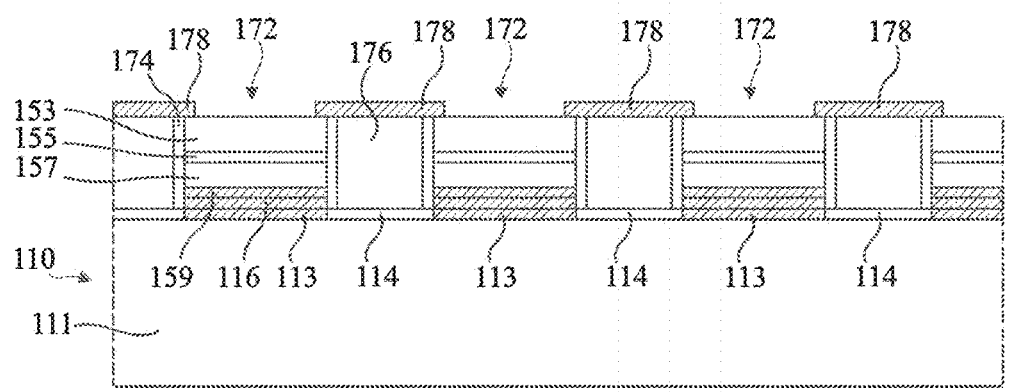

FIG. 1H illustrates a step subsequent to the step of FIG. 1G, during which trenches 170 are filled with an insulating material 176, for example, silicon oxide. As an example, a silicon oxide layer sufficiently thick to fill trenches 170 is deposited over the entire upper surface of the assembly, after which a planarization step, for example, a chem.-mech. polishing (CMP), is implemented to remove the silicon oxide from the upper surface of LEDs 172. At the end of this step, the upper surface of the assembly is substantially planar and comprises an alternation of insulating regions 174, 176 and of gallium nitride regions 153. As a variation, the step of filling trenches 170 (FIG. 1H) and the step of passivating the sides of the LEDs (FIG. 1G) may be combined.

FIG. 1H further illustrates a step subsequent to the filling of trenches 170 with insulating material 176, during which one or a plurality of metallizations 178 are formed on the upper surface of the device, in contact with the cathode regions 153 of LEDs 172. In this example, the cathode regions of LEDs 172 are all connected to a same metallization 178. Metallization 178 forms a grid contacting, on each of LEDs 172, a peripheral portion of the upper surface of cathode region 153 of the LED. At the level of each of LEDs 172, a central portion of the LED is however not covered with metal grid 178, to enable the passing of the light emitted by the LED. Indeed, in the shown example, the display device is intended to be observed on its upper surface side. Metal grid 178 may be connected to control circuit 110, for example, via one or a plurality of vias (not shown) formed in active stack 150 or in insulating material 176 filling trenches 170, for example, in a peripheral region of the device.

Figure 1I:
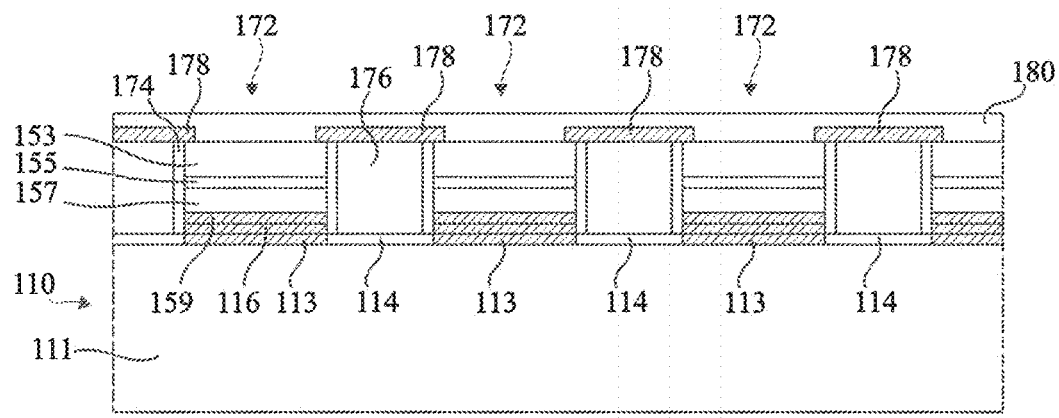

FIG. 1I illustrates a step subsequent to the deposition of metallizations 178, during which an insulating layer 180, for example, made of silicon oxide, is deposited over substantially the entire upper surface of the device, to protect metallizations 178 and the apparent portions of gallium nitride layer 153. Insulating layer 180 may be planarized to obtain a display device having a substantially planar upper surface.

In the embodiment described in relation with FIGS. 1A to 1I, the deposition of metal layers 116 and 159 on control circuit 110 and on active stack 150 (step of FIG. 1B) prior to the transfer of active stack 150 onto control circuit 110 (step of FIG. 1C) has several advantages.

In particular, layers 116 and 159 enable to improve the quality of the bonding between the two structures. Indeed, although it is possible, the direct bonding of the upper surface (in the orientation of FIG. 1A) of gallium nitride layer 157 to the upper surface of control circuit 110 (comprising an alternation of insulating regions 114 and of metal regions 113) is relatively difficult to achieve.

Further, layer 159 may advantageously be selected to achieve a good ohmic contact with gallium nitride layer 157. The material of metal pads 113 of control circuit 110, for example, copper or aluminum, may indeed not be adapted to the forming of such an ohmic contact.

Further, layers 116 and/or 159 may comprise a metal which is reflective for the light emitted by LEDs 172, to increase the emission efficiency and avoid light losses in control circuit 110.

Further, layer 116 and/or layer 159 may be selected to avoid for the metal of connection pads 113 of the control circuit, for example, copper, to diffuse towards gallium nitride layer 157, which might in particular degrade the quality of the ohmic contact with gallium nitride layer 157.

In practice, each of layers 116 and 159 may be a single layer or a stack of one or a plurality of layers of different materials enables to ensure all or part of the above-mentioned functions.

As an example, layer 116 comprises an upper layer made of a metal of same nature as an upper layer (in the orientation of FIG. 1B) of layer 159, the metal being selected to obtain a good bonding between the two structures during the step of FIG. 1C, for example, a metal from the group comprising Ti, Ni, Pt, Sn, Au, Ag, Al, Pd, W, Pb, Cu, AuSn, TiSn, NiSn, or an alloy of all or part of these materials. The stack formed by layers 116 and 159 may further comprise one or a plurality of layers made of metals capable of reflecting the light emitted by the LEDs, for example, silver. Further, the stack formed by layers 116 and 159 may comprise one or a plurality of layers capable of forming a barrier against the diffusion of metals such as copper or silver comprised in stack 116/159 and/or in metal pads 113, for example, layers of TaN, TiN, WN, TiW, or of a combination of all or part of these materials.

As a variation, layer 116 and/or layer 159 may however be omitted. Preferably, at least one of layers 116 and 159 is provided, preferably layer 159 formed on the side of active LED stack 150.

Figure 2:
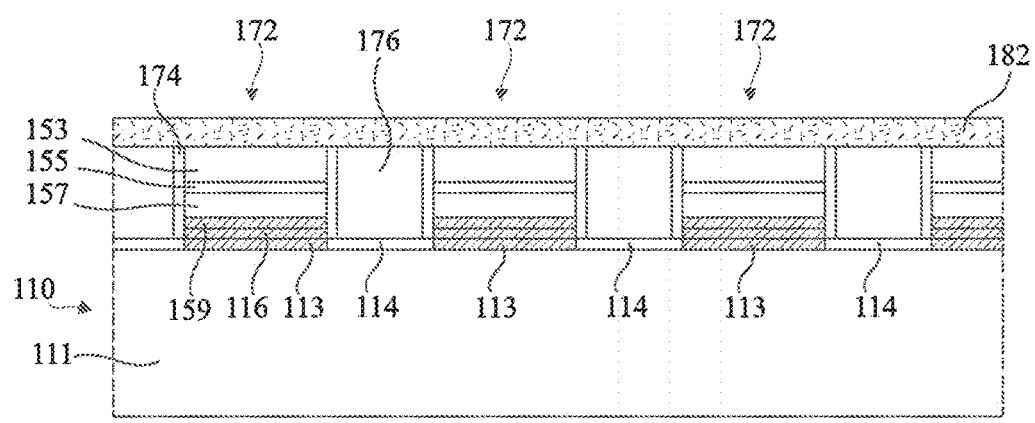
FIG. 2 is a cross-section view illustrating an alternative embodiment of the method of FIGS. 1A, 1B, 1C, 1D, 1E, 1F, 1G, 1H, 1I.

FIG. 2 is a cross-section view illustrating an alternative embodiment of the method of FIGS. 1A, 1B, 1C, 1D, 1E, 1F, 1G, 1H, 1I. The method of FIG. 2 differs from the previously-described method essentially in that, at the step of FIG. 1H, after the filling of trenches 170 with insulating material 176, the contact with the cathode regions of LEDs 172 is formed, rather than by means of a metallization 178 made of an opaque material, by an electrode 182 made of a transparent conductive material, for example, made of ITO (indium tin oxide). In the shown example, electrode 182 is a continuous electrode coating substantially the entire upper surface of the device. In particular, in this example, electrode 182 covers substantially the entire upper surface of LEDs 172. Electrode 182 may be connected to control circuit 110, for example, via one or a plurality of vias (not shown) formed in active stack 150 or in insulating material 176 filling trenches 170, for example, in a peripheral region of the device.

FIGS. 3A, 3B, 3C, 3D are cross-section views illustrating steps of another alternative embodiment of the method of FIGS. 1A, 1B, 1C, 1D, 1E, 1F, 1G, 1H, 1I adapted to the forming of a color image display device. Indeed, in the example of FIGS. 1A, 1B, 1C, 1D, 1E, 1F, 1G, 1H, 1I, LEDs 172 are all substantially identical, and emit substantially at the same wavelength. The device obtained at the end of the step of FIG. 1I thus is a monochromatic display device.

The method of FIGS. 3A, 3B, 3C, 3D is implemented, starting from the device obtained at the end of the method of FIGS. 1A, 1B, 1C, 1D, 1E, 1F, 1G, 1H, 1I. This structure is shown again in FIG. 3A.

Figure 3A:
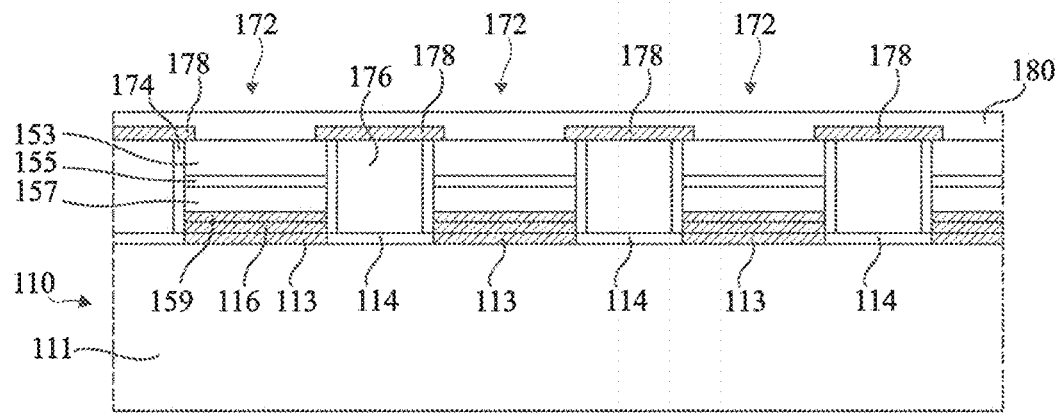
FIGS. 3A, 3B, 3C, 3D are cross-section views illustrating another alternative embodiment of the method of FIGS. 1A, 1B, 1C, 1D, 1E, 1F, 1G, 1H, 1I.
Figure 3A:

FIG. 3A further schematically illustrates a step of forming, on the upper surface of a support substrate 201, for example, a GaAs substrate, a photoluminescent conversion stack 203 with multiple quantum wells. Stack 203 comprises a plurality of layers, each defining a quantum well. Stack 203 is capable of absorbing photons at the emission wavelength of LEDs 172 and of reemitting photons at another wavelength. As an example, stack 203 is capable of converting blue light into red light or red light into green light. Conversion stack 203 is for example formed by epitaxy on support substrate 201.

In the shown example, a coating layer 205, for example, an oxide layer (for example, silicon oxide), is deposited on and in contact with the upper surface of conversion stack 203, layer 205 extending over substantially the entire upper surface of conversion stack 203.

Figure 3B:
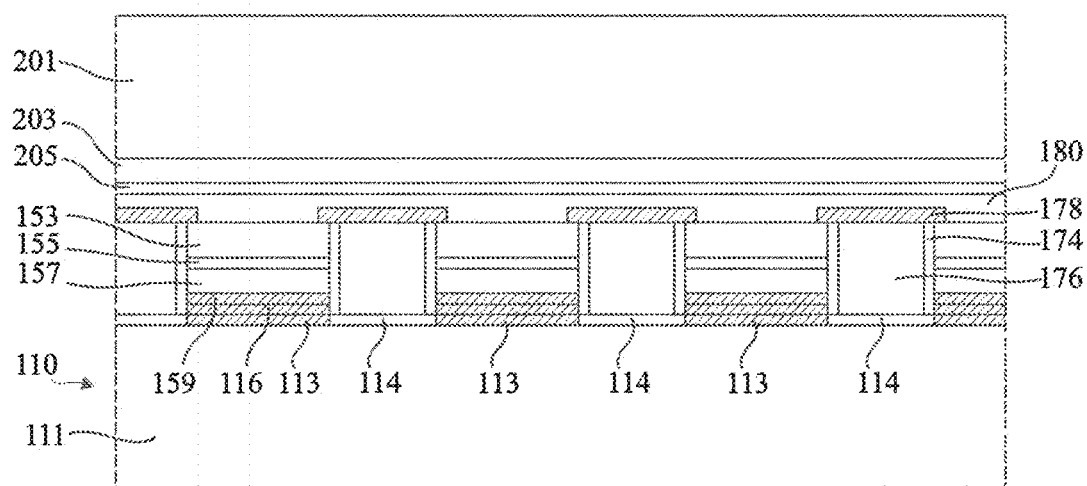

FIG. 3B illustrates a step during which conversion stack 203 is placed on the upper surface of the display device. To achieve this, the assembly comprising support substrate 201 and conversion stack 203 may be flipped and then placed on the display device, to place the upper surface (in the orientation of FIG. 3A) of coating layer 205 into contact with the upper surface of upper layer 180 of the display device. During this step, conversion stack 203 is bonded to the display device. As an example, the bonding of active stack 203 to the display device may be obtained by molecular bonding between the two surfaces placed into contact. As a variation, the bonding of the two surfaces may be performed by thermocompression, eutectic bonding, or by any other adapted bonding method. Coating layer 205 enables to favor the bonding of the two structures. However, as a variation, layer 205 may be omitted, the upper surface (in the orientation of FIG. 3A) of conversion stack 203 being then directly placed into contact with the upper surface of the display device.

Figure 3C:
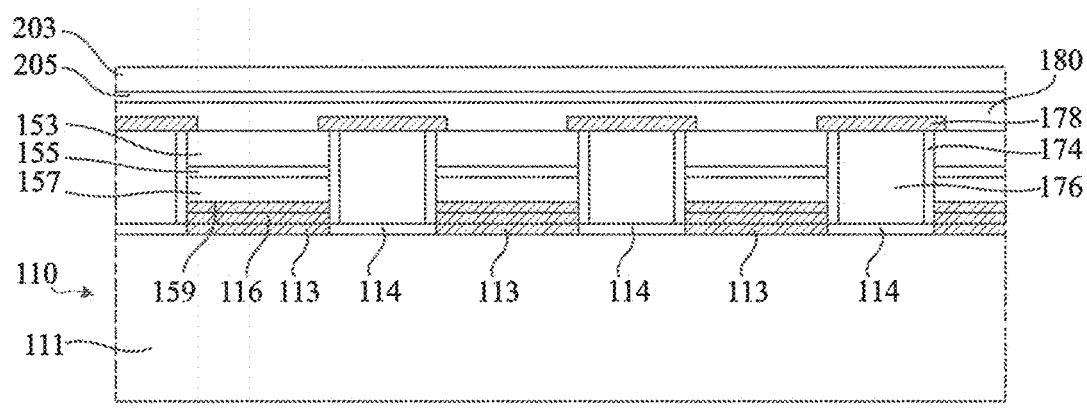

FIG. 3C illustrates a step subsequent to the transfer step of FIG. 3B, during which support substrate 201 of conversion stack 203 is removed. Substrate 201 is for example removed by grinding and/or chemical etching from its upper surface, that is, its surface opposite to conversion stack 203. At the end of this step, conversion stack 203 coats substantially the entire surface of the display device, with no discontinuity.

Figure 3D:
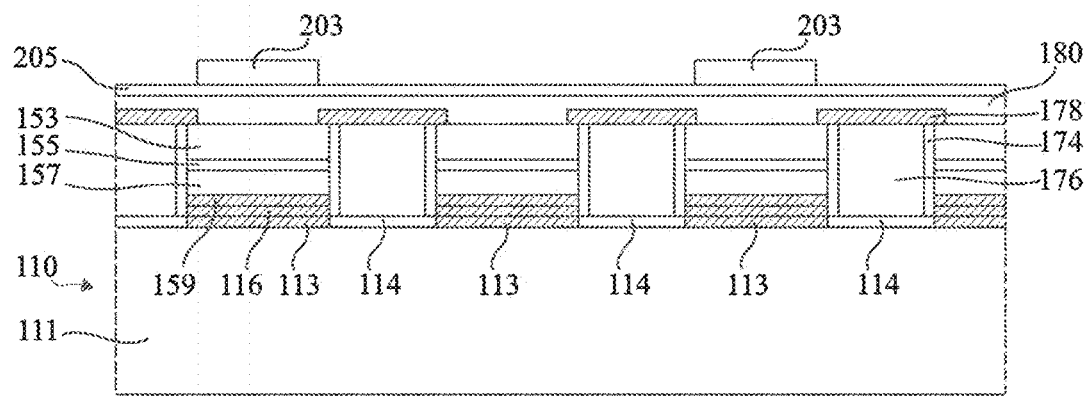

FIG. 3D illustrates a step subsequent to the step of FIG. 3C, during which portions of conversion stack 203 are removed, for example, by dry etching, opposite certain portions of the display device. More particularly, during this step, conversion stack 203 may be removed from above certain LEDs 172, and kept above the other LEDs 172. A display device comprising first pixels capable of emitting light at a first wavelength and second pixels capable of emitting light at a second wavelength is thus obtained.

As a variation, to increase the number of colors capable of being displayed by the device, the steps of FIGS. 3A, 3B, 3C, 3D may be repeated a plurality of times to deposit photoluminescent conversion stacks with multiple quantum wells having different conversion properties.

Further, as a variation, the method of FIGS. 3A, 3B, 3C, 3D may be implemented by taking as an initial structure the monochromatic display device of FIG. 2.

Specific embodiments have been described. Various alterations and modifications will occur to those skilled in the art. In particular, the conductivity types of gallium nitride layers 153 (of type N in the described examples) and 157 (of P type in the described examples) may be inverted.

Further, additional steps may be provided to form, on the upper surface side of the display devices, structures capable of improving the extraction of the light emitted by the LEDs.

Further, although only embodiments of display devices based on gallium nitride LEDs have been described, the described embodiments may be adapted to the manufacturing of a sensor comprising a plurality of gallium nitride photodiodes individually addressable to acquire an image.

More generally, the described embodiments may be adapted to the manufacturing of any display device or photosensitive sensor based on semiconductor diodes, including based on semiconductor materials other than gallium nitride, for example, diodes based on other III-V semiconductor materials or silicon-based diodes.

The invention claimed is:

1. A method of manufacturing an optoelectronic device, comprising the successive steps of:
   a) transferring, onto a surface of a control integrated circuit comprising a plurality of metal connection pads, an active diode stack comprising at least first and second doped semiconductor layers of opposite conductivity types, so that the second layer of the active diode stack is electrically connected to the metal pads of the control circuit; and
   b) forming in the active diode stack trenches delimiting a plurality of diodes connected to different metal pads of the control circuit.

2. The method of claim 1, further comprising, before step a), at least one of the steps of:
   a step of depositing at least one first metal layer over substantially the entire surface of the control circuit on the side of the metal pads; and
   a step of depositing at least one second metal layer over substantially the entire surface of the second semiconductor layer opposite to the first semiconductor layer.

3. The method of claim 2, wherein at least one of the first and second metal layers comprises a silver reflective layer.

4. The method of claim 2, wherein at least one of the first and second metal layers comprises a barrier layer made of TaN, TiN, WN, TiW or of a combination of one or a plurality of these materials.

5. The method of claim 2, wherein at least one of the first and second metal layers comprises a bonding layer made of Ti, Ni, Pt, Sn, Au, Ag, Al, Pd, W, Pb, Cu, AuSn, TiSn, NiSn, or of an alloy of all or part of these materials.

6. The method of claim 2, wherein the trenches formed at step b) extend all along the height of the active stack and cross the first and second metal layers.

7. The method of claim 1, wherein, during the implementation of step a), the active diode stack is supported by a support substrate located on the side of the first semiconductor layer opposite to the second semiconductor layer, the method further comprising, between step a) and step b), a step of removing the support substrate.

8. The method of claim 1, further comprising, after step b), a step of depositing, on each diode, an electrode on top of and in contact with the surface of the first semiconductor layer opposite to the second semiconductor layer.

9. The method of claim 8, wherein said electrodes form a continuous metal grid arranged so that, at the level of each diode, in a peripheral portion of the diode, the surface of the first semiconductor layer opposite to the second semiconductor layer is in contact with the grid and, in a central portion of the diode, the surface of the first semiconductor layer is not coated with the grid.

10. The method of claim 8, wherein said electrodes form a continuous layer made of a transparent conductive material, substantially coating the entire surface of the device.

11. The method of claim 1, wherein said semiconductor diodes are light-emitting diodes.

12. The method of claim 11, further comprising, after step b), a step of transferring, onto the surface of the device opposite to the control circuit, a photoluminescent conversion stack with multiple quantum wells substantially coating the entire surface of the device.

13. The method of claim 12, further comprising, after the transfer of the conversion stack, a step of removing the conversion stack opposite some only of the semiconductor diodes.

14. The method of claim 1, wherein said diodes are photodiodes.

15. The method of claim 1, wherein the first and second semiconductor layers are gallium nitride layers, said diodes being gallium nitride diodes.

* * * * *